United States Patent [19]

Gunter

[11] Patent Number: 4,814,947
[45] Date of Patent: Mar. 21, 1989

[54] SURFACE MOUNTED ELECTRONIC DEVICE WITH SELECTIVELY SOLDERABLE LEADS

[75] Inventor: Charles E. Gunter, Jupiter, Fla.

[73] Assignee: North American Philips Corporation, New York, N.Y.

[21] Appl. No.: 157,426

[22] Filed: Feb. 17, 1988

[51] Int. Cl.[4] .............................................. H01G 9/00
[52] U.S. Cl. ................................................... 361/540
[58] Field of Search .......................... 29/827; 361/433; 338/226; 204/15

[56] References Cited

U.S. PATENT DOCUMENTS

| | | |
|---|---|---|
| 2,636,920 | 4/1953 | Lockery et al. ............... 29/827 X |
| 3,271,625 | 9/1966 | Caracciolo ..................... 29/827 X |
| 3,948,736 | 4/1976 | Russell ............................ 204/15 |
| 4,539,623 | 9/1985 | Irikura et al. ................... 361/433 |
| 4,590,672 | 5/1986 | Shimizu et al. ................. 29/827 |
| 4,660,127 | 4/1987 | Gunter ............................ 361/433 |
| 4,672,358 | 6/1987 | Pryst et al. ..................... 338/226 |

*Primary Examiner*—Donald A. Griffin
*Attorney, Agent, or Firm*—John C. Fox

[57] ABSTRACT

A surface mounted device (SMD) having leads selectively solderable so that those portions of the leads extending down along the sides of the device body are not solderable. Thus, during attachment to a mother board by wave soldering, solder does not collect in the spaces between the leads and the device body, and both solder joint reliability and strength are improved.

8 Claims, 1 Drawing Sheet

SURFACE MOUNTED ELECTRONIC DEVICE WITH SELECTIVELY SOLDERABLE LEADS

BACKGROUND OF THE INVENTION

The invention relates generally to a chip-like electronic component of a type designed for surface mounting, a so-called "Surface Mounted Device" or SMD.

Chip-like electrical components, sometimes referred to as leadless components and/or surface mounted devices, are well known in the prior art. One type of such devices is the solid electrolyte capacitor. The present invention, while not limited to such capacitors, will be described in terms of these devices.

Among the recent U.S. patents which describe solid electrolyte chip capacitors in some detail are U.S. Pat. Nos. 4,510,554 and 4,539,623, both assigned to Matsushita Electric Industrial Co., Ltd., and U.S. Pat. Nos. 4,571,664 and 4,660,127, both assigned to the assignee of this application. The latter patents are incorporated herein by reference.

Briefly, a solid electrolyte chip capacitor has a capacitor body including a porous valve metal anode member of very high surface area, usually of sintered tantalum, and an anode riser wire of the same valve metal extending from one end face thereof. A dielectric oxide film is thermally grown on the porous surfaces of the anode member. The pores are then filled with an intermediate oxide by impregnating the member with a solution of $MnNO_3$, and then heating to form $MnO_2$. The remaining surface area of the electrolyte-filled member (excluding the anode riser wire end face) is then covered with a carbon layer to provide electrical connection to the dielectric network, and finally coated with a conductive solderable material to provide an outer cathode layer. The capacitor body is then finished into its final form which may include an outer encapsulant of an insulating material.

The resulting SMD is leaded in such a way that it can be mounted and connected to a given circuit using a minimum amount of space on the circuit board. For this purpose, leads which extend a short distance away from the end faces of the device, and then descend parallel to and spaced apart from the end faces of said capacitor body, are preferred. The anode lead is welded to the riser wire, while the cathode lead is directly connected to the cathode terminal on the capacitor body. The ends of both leads are bent so as to be parallel to the mounting board, either outward away from the body, or preferably, to conserve space, inward. In the latter case, indents may be molded into the body to provide clearance for the leads. This preferred lead configuration will be referred to herein as the J-shaped configuration.

The lead constructions are designed not only to minimize mounting space, and thus maximize device density on the printed circuit board, but also to improve compliance of the device, both during mounting and afterwards.

In one method of mounting, a solder paste containing a flux is applied, such as by screen printing, to areas of the circuit pattern where the leads are to be attached. Next, the device is fixed in its proper location by adhering the body to the board using an organic adhesive such as a two-part epoxy or a u.v. curable resin. The board is then inverted and passed through a standing wave of molten solder, to achieve a solder joint. Finally, the board is washed in a solvent to remove the flux.

Because of differences in thermal expansion between the SMD and the board, the temperature cycling to which the assembly is subjected during soldering causes stresses on the solder joints. The J-shaped configuration of the leads, and their spaced apart relation to the device body, is intended to permit flexing during thermal cycling to relieve the stress and prevent degradation of the solder joints.

However, in practice, the molten solder tends to fill the spaces between the leads and the body of the device, reducing flex and leading to serious degradation or even failure of the solder joints.

Accordingly, it is an object of the invention to produce an SMD which can be reliably electrically connected to a printed circuit board.

It is another object of the invention to produce an SMD of the type known in the prior art, having leads spaced-apart from the body of the SMD, which leads can be reliably attached to the circuit pattern of a mother board such as a printed circuit board.

It is another object of the invention to produce an SMD of the type known in the prior art having leads with a J-shaped configuration, and spaced from the body of the SMD, which leads can be reliably attached to a mother board.

SUMMARY OF THE INVENTION

According to the invention, an SMD is provided with leads which are selectively solderable. That is, only those portions of the surfaces of the leads which are not adjacent to the device body are solderable. In one embodiment, the leads have a J-shaped configuration, and only one side of the leads, facing away from the device body, are solderable. The leads are preferably fabricated from a planar sheet, such as a lead frame, having only one side which is solderable. In another embodiment, only portions of the lead surfaces including those which are to make contact with the circuit board are solderable. In such embodiment, the ends of the leads which make electrical contact with the board may either turn inward toward the device body, corresponding to the J-shaped configuration, or outward, away from the device body. In still another embodiment, the outside surfaces of J-shaped leads are solderable, as well as a portion of the inside surface of the cathode lead, at least the portion which makes electrical contact with the cathode terminal.

Such leads are typically fabricated from a copper-clad copper alloy, such as a copper-nickel-zinc alloy, but may also be fabricated from other materials, such as copper-clad stainless steel. Such materials can be rendered solderable by the application of a solder layer such as tin or a tin-lead alloy, over the copper cladding, such as by hot dipping, but more typically by electroplating. Clad sheet material is conventionally electroplated or coated on both sides, and then fabricated into lead frames. However, for use with this invention, such electroplating or coating is selectively applied, for example, to one side only of the clad sheet, by masking the other side. Such masking may be achieved, for example, by covering the side with tape, by attaching the sheet to a drum, whereby only one side is exposed to plating or coating, or by joining two sheets back-to-back, whereby both opposing surfaces can be plated or coated simultaneously. For the embodiments of the invention requiring selective applicability to one side or the other of the sheet, various selective masking techniques are available, and are generally known, so that a description of them here is unnecessary.

Application of the solder layer to the lead frame renders the lead surface solderable by virtue of the affinity of the solder for similar materials in the molten solder bath, eg., tin. However, as used herein, the term "solderable" has a broader meaning, and is meant to include any surface which is subject to appreciable wetting and adherence by molten solder. Accordingly, other materials which increase the wettability and adherence of the solder to the surface can be used, such as gold, silver or nickel plating. In addition, it is contemplated that further surface treatments may be desirable to reduce the solderability of the remaining surfaces, or at least those which will face the body of the SMD. Such treatments could include oxidation, coating with a thermally resistant organic resin, or coating, plating or cladding with a metal layer having poor solder wettability, such as chromium.

By having a less solderable surface facing the device body, the probability of this area filling with solder during attachment of the leads to a printed circuit board is considerably reduced. This provides better compliance of the device, and thus reduces the probability of weakening or breaking of the solder joints during temperature cycling or mechanical flexing of the assembly. In addition, substantial cost savings can be realized by eliminating the solderable layer on at least one side of the lead frame. Furthermore, by not coating or plating the lead frame in the area where the anode riser wire is welded to the anode lead, a superior weld is obtained.

DESCRIPTION OF THE PREFERRED EMBODIMENTS

As mentioned earlier, the preferred embodiments will be described with respect to a solid electrolyte capacitor and specifically a tantalum chip capacitor. This embodiment is described by way of illustration and not by way of limitation.

Figure 1:
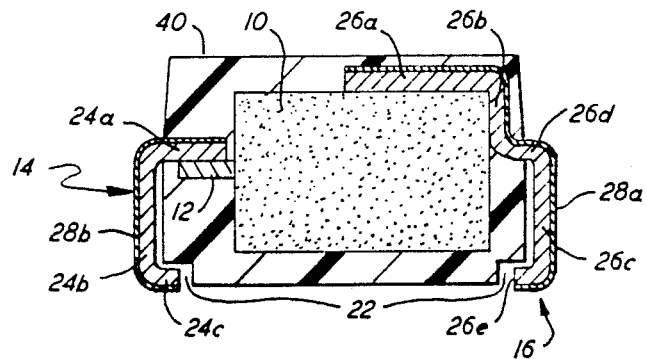
FIG. 1 is a side section view of one embodiment of a solid electrolytic chip capacitor showing single-side plated leads embodying the present invention.

Referring now to FIG. 1, which shows a section view of a solid electrolyte chip capacitor according to the present invention, the capacitor body 10 has substantially the same structure as a conventional solid electrolyte capacitor, except for the structure of the lead configuration.

The capacitor body 10 has left and right end faces and upper and lower or base surfaces. For purposes of exposition, the left end shall be considered the positive (anode) end and the right end shall be considered the negative (cathode) end. Each end has a termination which permits the electrical connection of a lead thereto. On the anode end, anode riser wire 12 serves as the anode termination, and is welded to an anode lead 14. On the cathode end, cathode lead 16 is connected via a conductive member such as a solder or conductive adhesive (not shown) to the cathode termination surface of capacitor body 10. Casing 40 made of an insulating substance, encapsulates capacitor body 10 and anode riser wire 12 as well as a portion of the anode lead 14 and a portion of the cathode lead 16. The casing 40 defines notches 22 at the base ends to accommodate the lead portions 24c and 26e, but preserves a generally hexahedral chip shape which will be approximately flush with a printed circuit board.

Anode lead 14 is generally J-shaped, having one upper leg 24a welded or otherwise secured, in this case welded to the anode riser wire 12. A second, middle leg 24b descends to the base of and is spaced apart from the left end of the device 10. The third and shortest leg, base leg 24c extends inward toward the capacitor body 10, partially into indent or notch 22. This leg may extend outward rather than inward.

Cathode lead 16 is also generally J-shaped, having an upper leg 26a secured to the cathode terminal by conventional means such as a conductive adhesive or solder (not shown) at the right side of the top of the capacitor body 10, a middle leg of several sections, an upper section 26b, descending partially down the endface and then continuing laterally into middle section 26c secured to the end of said upper section 26b by crook-shaped segment 26d. Lower base leg 26e may either be bent inward toward the base of said capacitor body, as shown, into notch 22, or outward. Lead 24c may be narrow in width and centrally positioned and lead 16 may be bifurcated into two narrow branches spaced apart from one another, in order to form a fail-safe bifurcated lead configuration for polar devices, as provided in U.S. Pat. No. 4,660,127.

In the embodiment of FIG. 1, the outside surfaces of the J-shaped leads 14 and 16 bear a layer 28a and 28b of a solderable material such as tin, or a tin-lead alloy. By avoiding a solderable layer on the inside surface of the leads 14 and 16, the wettability of these surfaces to molten solder (to which these surfaces are exposed during the typical wave soldering operation) is relatively poor and the probability of such molten solder filling the spaces between the leads and the molded body or casing 40 of the SMD is considerably reduced.

Another advantage of avoiding a solderable layer on the inside surface of the cathode lead is that a more reliable bond between the body (10) and the upper leg 26a of the cathode lead is obtained when conductive adhesive is used to make the bond. Such conductive adhesive is sometimes preferred over a solder bond, since if the device is exposed to sufficient temperature for long enough time, as when installing the device on a printed wiring board, a solder bond can remelt, thereby degrading the electrical connection. It can thus be appreciated that the conductive adhesive bond is more reliable when the lead itself is free of any solderable layer which could melt during installation.

Figure 2:
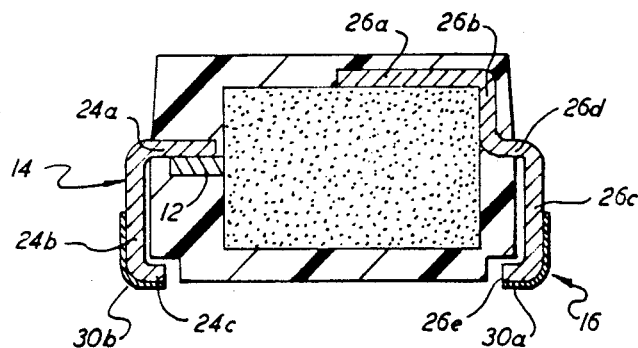
FIG. 2 is a side section view of another embodiment of a solid electrolytic chip capacitor showing single-side plated lead ends embodying the present invention.

FIG. 2 shows another embodiment of an SMD in accordance with the invention, the Figure being identical in all respects to FIG. 1 except that only the lower base legs 24c and 26e of the leads 14 and 16 are covered with layers of solderable material 30b and 30a, respectively. While this embodiment may be advantageous in that it offers additional material savings over the embodiment of FIG. 1, it does, of course, require the partial masking of the outside surface of the lead frame as well as total masking of the inside surface during plating or coating of the solderable layer, in order to achieve such additional material savings.

Figure 3:
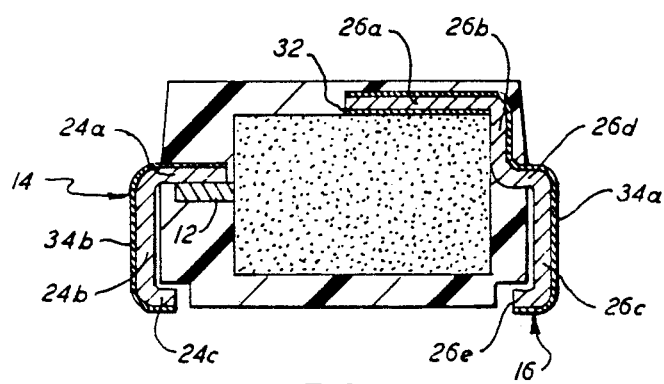
FIG. 3 is a side section view of still another embodiment of a solid electrolyte chip capacitor showing selectively plated leads embodying the present invention.

FIG. 3 shows another embodiment of an SMD in accordance with the invention, the Figure being identical in all respects to that of FIG. 1, except that in addition to having the outside surfaces of the leads 14 and 16 coated with layers of solderable material 34b and 34a, a portion of the inside surface of the upper leg 26a of cathode lead 16 is also coated with a layer of solderable material 32. This embodiment may be advantageous in those instances where the cathode lead 16 is attached to the cathode terminal by means of a solder joint. Thus, the solderability of the layer to the cathode surface is enhanced.

Other embodiments will become apparent to those skilled in the art.

I claim:

1. A surface mounted device for mounting to a circuit board, the device comprising: an electronic device body having right and left side surfaces; at least two electrical leads connected to the device, the first lead having an upper portion extending laterally a short distance from the right side of the device, and the second lead having an upper leg extending laterally a short distance from the left side of the device; an electrically insulating encapsulant also having right and left side and base surfaces, the encapsulant surrounding the electronic device body and substantially the upper lateral portions of the leads which are attached to the device; each lead also having a middle portion extending downward from the upper lateral portion in a spaced-apart relationship with the sides of the encapsulant, and each lead also having a terminal portion extending laterally from the middle portion, the lower surfaces of such terminal portions being approximately coextensive with the base surface of the encapsulant and being intended for soldered electrical connection to a circuit board;

characterized in that the wettability to molten solder of at least the surfaces of the leads exterior to the encapsulant and facing the encapsulant is relatively poor, whereby the probability of molten solder filling the spaces between the leads and the encapsulant is reduced.

2. The surface mounted device of claim 1 in which the terminal portions of the leads extend inward toward the sides of the encapsulant.

3. The surface mounted device of claim 2 in which the encapsulant defines notches in the lower corner regions adjacent the terminal portions of the leads, and in which the terminal portions of the leads extend at least partially into the notched spaces defined by the encapsulant.

4. The device of claim 2 in which the wettability to molten solder of the entire inside surfaces of the leads is relatively poor.

5. The device of claim 4 in which the device is a solid electrolyte capacitor, the lead extending laterally from the right side of the device is a cathode lead, the cathode lead upper portion including a leg extending upward along the right side of the device from the lateral portion and extending laterally along the top surface of the device from the vertical portion, these portions being electrically connected to the cathode surface and encapsulated by the encapsulant, characterized in that at least part of the cathode lead surfaces are electrically connected to the device by a conductive adhesive layer of material.

6. The surface mounted device of claim 1 in which the wettability to molten solder of the entire surfaces of the leads except the terminal portions of the leads to be electrically connected to the circuit board is relatively poor.

7. The surface mounted device of claim 6 in which the terminal portions extend inward toward the sides of the encapsulant.

8. The surface mounted device of claim 6 in which the terminal portions extend outward away from the sides of the encapsulant.

* * * * *